MULTIELEMENT SEMICONDUCTOR DEVICES

Filed Jan. 21, 1953

INVENTOR.
GEORGE C. SZIKLAI

BY J. L. Whittaker
ATTORNEY 2,735,948

MULTIELEMENT SEMICONDUCTOR DEVICES

George C. Sziklai, Princeton, N. J., assignor to Radio Corporation of America, a corporation of Delaware Application January 21, 1953, Serial No. 332,459

10 Claims. (Cl. 307—88.5)

This invention relates generally to semiconductor devices and particularly to composite multi-element semiconductor devices.

Amplification of the direct current component of a signal, as well as the low-frequency and higher-frequency components of the signal, is often desired in the electronic arts. There has been some difficulty in achieving this objective with electron discharge devices because of the static direct current voltage requirements of electron discharge devices and the fact that they are voltage-operated devices, that is, the output voltage is primarily a function of input voltage.

One solution of this problem is shown in applicant's co-pending U. S. patent application, Serial No. 320,713, filed November 15, 1952, and assigned to the assignee of this application. Said application discloses a plurality of separate semiconductor devices which are directly connected in cascade to provide an amplifier which amplifies the direct current component of an input signal, as well as the low-frequency and higher-frequency components. The output of one semiconductor device in the amplifier is directly connected to the input of the next following semiconductor device, without the need for a coupling capacitor such as is employed in amplifiers including electron discharge devices.

An important object of this invention is to provide a novel and improved semiconductor device having unique structural form.

Another object is to provide an improved unitary semiconductor device for performing the functions of a plurality of single transistors.

A further object is to provide an improved semiconductor device of economical and comparatively simple construction.

The instant invention utilizes a P–N type semiconductor device as its basic element. A typical P-N junction type semiconductor device, such as a P-N-P or N-P-N transistor, comprises a body of semiconductor material having zones or regions of alternating N-type and P-type conductivity. Any two adjacent zones are separated by a rectifying barrier which has high resistance to electrical current flow in one direction and low resistance in the other direction. Generally, for example in a P-N-P device, one of the P-type zones is biased to operate as an emitter of electrical charge carriers and the other P-type zone is biased to operate as a collector of these carriers. The N-type functions as a base electrode.

In general, the principles and objects of this invention are accomplished, for example, by the provision of a semiconductor body in the form of a comparatively thin block comprising four alternating zones or regions or strips of P-type and N-type conductivity material extending the length of the body and separated by rectifying barriers. The strips comprise two lateral edge zones and two interior zones. A plurality of transverse, zone-intersecting channels are formed along the length of the body. The channels extend inwardly from the lateral edge zones with successive channels originating from opposite edge zones of the device. That is, the first channel, for example, intersects the first and second zones and extends into the third zone through the barrier separating the second and third zones. The next channel intersects the fourth and third zones and extends into the second zone through the barrier separating the third and second zones. The third channel intersects the first and second zones and a portion of the third, etc. Bias voltage sources are connected to each of the lateral edge zones, i. e. the first and the fourth zones, so that they are biased in the forward direction with respect to the next adjacent zones and so that they can function as emitter electrodes. The bias voltage source also appropriately affect said next adjacent zones. A signal source is connected to either the second or third zones depending on whether the first channel originates at the first or fourth zones. Thus, the first amplification stage is on one side of the first channel and comprises a portion of the first zone as an emitter electrode, a portion of the second zone as base and input electrode, and a portion of the third zone as collector electrode. The next amplification stage comprises a portion of the fourth zone as emitter electrode, the former collector zone as base and input electrode, and a portion of the second zone on the other side of the first channel as the collector electrode and so forth to the end of the device.

The invention is described with reference to the single sheet of drawings wherein.

Like elements are designated by the same reference numerals throughout the drawings.

Figure 1:
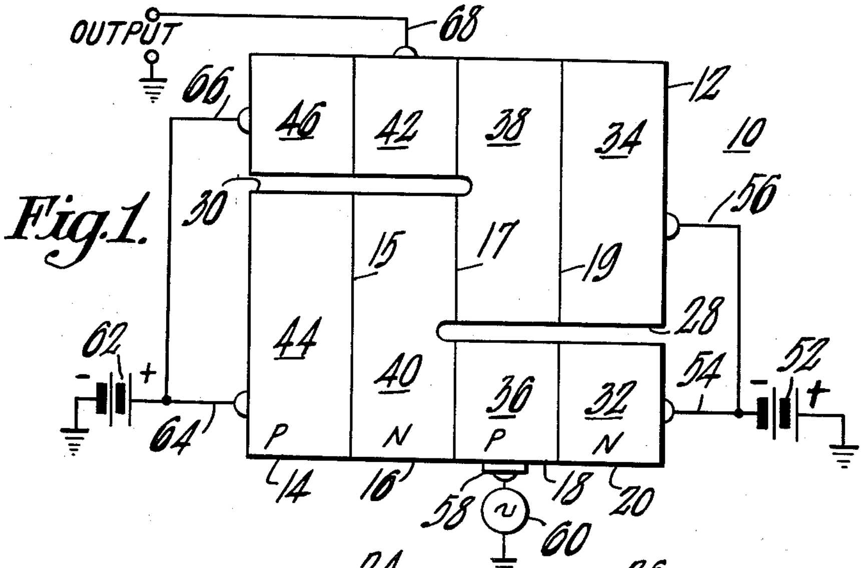
Fig. 1 is a plan view of one embodiment of the invention.
Figure 2:
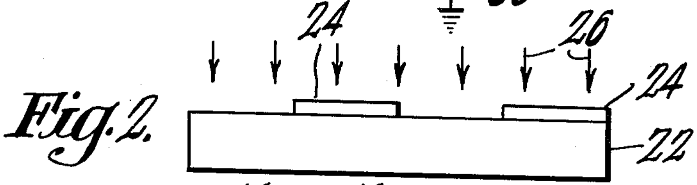
Fig. 2 is a sectional, elevational view of the device shown in Fig. 1 at an early stage in its preparation.

A first embodiment of the invention includes a semiconductor 10 comprising a semiconductor body 12 having four alternating regions or zones 14, 16, 18, 20 of opposite type conductivity material separated by rectifying barriers 15, 17, 19 in P-N-P-N order, for example as shown in Figure 1. The device may also be constructed in the form of alternating N-P-N-P zones. U. S. Patent No. 2,588,254 discloses several methods for preparing a semiconductor body such as that shown in Figure 1. According to one suitable method and referring to Figure 2, a thin block 22 of N-type semiconductor, preferably germanium, is employed. The germanium block should be of a thickness small enough to be transparent to the bombarding particles used for changing the N-type germanium to P-type, and of a length determined by the final effective amplification desired. The block should have at least one surface ground substantially flat. This flat surface is covered with a plurality of strips of material 24 suitable for absorbing charged nucleons. These strips may be of lead, palladium, gold, etc. The entire surface is then bombarded with charged nucleons, represented schematically by the arrows 26, which may be cause to strike the surface 4 at about a 90° angle.

Figures 3, 4:
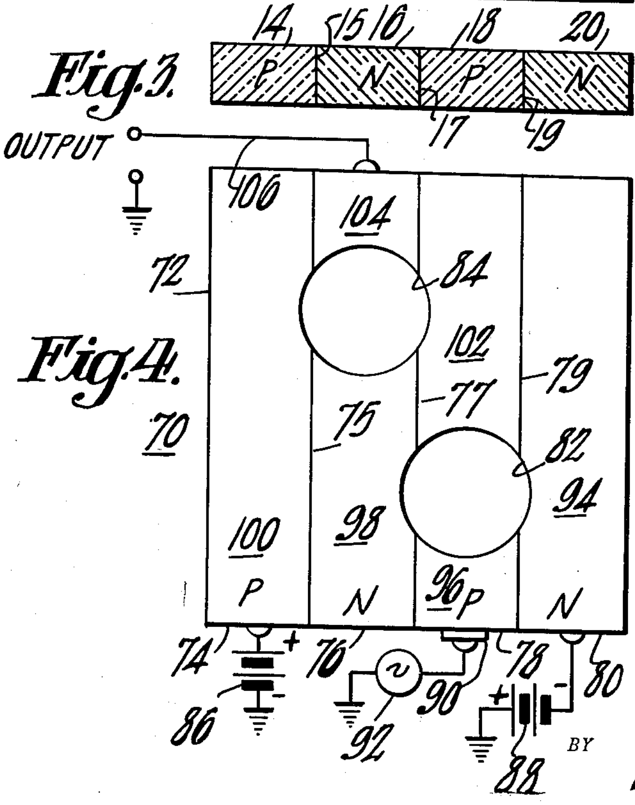
Fig. 3 is a section taken along the line 3—3 in Fig. 1.
Fig. 4 is a plan view of another embodiment of the invention.

The article which results from this method of treatment is illustrated in cross-section in Figure 3. The original body of N-type germanium has been converted into the striated body 12 in which N-type regions 16 and 20 alternate with P-type regions 14 and 18 with the high resistance barriers 15, 17, 19 between the two types of regions.

Another suitable method for preparing the body 12 having four alternating zones of opposite type conductivity material is described in a co-pending U. S. application of Arnold R. Moore, Serial Number 285,584, filed May 1, 1952, and assigned to the assignee of this application.

Briefly, Moore describes a method and apparatus for growing crystals with adjacent zones of different composition comprising a large carbon crucible rotatably mounted on a shaft within an electric furnace. The large carbon crucible is divided into three smaller crucibles separated by walls. The smaller crucibles contain melts of the material to be crystallized, the melts having a different conductivity type composition. Valves connect the smaller crucibles as desired. In operation, a seed crystal is lowered on the end of a shaft until it touches the surface of the melt in one of the small crucibles. The seed crystal is then withdrawn so that a portion of the melt crystallizes upon it growing a zone. Then the growing crystal is transferred to an adjacent crucible without breaking contact with the melt so that another different conductivity zone is grown. This process may be continued to grow more zones.

Next, the body 12 is divided into a series of transistor stages by a plurality of channels 28, 30 formed therein. The channels may be formed by a cutting operation with a grinding wheel or the like. This operation may also be performed according to the teaching of Barton and Hurley in co-pending U. S. application, Serial Number 329,302, filed January 2, 1953, and assigned to the assignee of this application. According to Barton and Hurley, an abrasive coated blade, wire, thread or the like is used for cutting channels in semiconductor material. A conventional transistor etching operation follows the cutting step. Two channels are present in the device 10 shown in Figure 1, however, substantially any number may be employed, with the number being determined by the desired resultant amplification of the completed device.

The channels 28 and 30 are formed in alternating arrangement to completely intersect two adjacent zones including one of the lateral edge zones 14 or 20 and extending slightly into the third zone 18 or 16, respectively. Thus, the first channel 28 intersects, for example, the N and P zones 20 and 18 respectively, passes through the barrier 17 and extends slightly into the next N-type zone 16. The next channel 30 completely intersects the P and N zones 14 and 16 respectively and extends slightly into the next adjacent P-type zone 18 through the barrier 17. Thus, the N-type zone 20 is divided into two portions 32, 34; the P-type zone 18 into portions 36, 38; the N-type zone 16 into portions 40, 42; and the P-type zone 14 into portions 44, 46. The channels 28 and 30 may be positioned as close together as desired consonant with the free flow of electrical charge carriers in the body of the device.

The device 10 shown in Figure 1 may be operated as follows: The negative terminal of a source of bias voltage 52 is connected to the portions 32, 34 of the outer N-type zone 20 by a plurality of connections 54, 56. The positive pole of the source 52 is grounded. The portions of the N-type zone 20 are thereby biased in the forward direction with respect to the portions 36, 38 of the P-type region 18 adjacent thereto. The portion 38 is also thus biased somewhat negatively with respect to ground thereby. An ohmic contact base electrode 58 is soldered to the portion 36 of the P-type region 18. A source of signal voltage 60 is applied beween said base electrode 58 and ground. Another source of voltage 62 has its negative terminal grounded and its positive terminal is connected through a plurality of leads 64, 66 to the portions 44, 46 of the P-type region 14, which are thereby biased in the forward direction with respect to the portions 40, 42 of the N-type region adjacent thereto. The portions 40 and 42 thus are biased somewhat positively with respect to ground thereby. Thus the P-type regions 44, 46 are also biased to operate as emitters.

The first stage of the device comprises an N-P-N transistor including the portions 32, 36, 40 of the zones 20, 18, 16 respectively. The N-type portion 32, as a result of its negative bias functions as the emitter electrode and injects electrons into the adjacent P-type portion 36 which functions as the base electrode. The current flow is controlled by the signal from the source 60 connected to the base electrode 62. The adjacent N-type portion 40 as a result of its positive bias from the source 62, acts as the collector for the electron current from the emitter electrode 32.

The second stage of the device comprises a P-N-P transistor and includes the P-N-P zones 44, 40, 38 respectively. The outer P-type zone 44 being biased positive operates as the emitter electrode for the second stage and injects holes into the N-type zone 40 which now constitutes the input or base electrode for the second stage. Under the control of the current fed into the base electrode 40 (collector electrode for the first stage) the injected holes are attracted to the P-type portion 38 which acts as the collector for the second stage as a result of its negative bias from the source 52.

The third stage of amplification of the device comprises an N-P-N transistor and includes the N-P-N portions 34, 38, 42. The N-type region 34 operates as the emitter electrode and injects electrons into the portion 38 (the collector of the second stage) which becomes the base input electrode for the third stage. Under the influence of the hole flow into the base electrode 38, the electron flow from the portion 34 is fed to the region 42 which is biased positively by the source 62 and is the collector electrode for the third stage. A lead 68 connected to the N-type zone 42 constituting the collector of the third stage is further connected to any suitable output utilization circuit (not shown). If the device were extended to include further stages of amplification, the region 46 would constitute the emitter of the fourth stage and the region 42 would comprise the base input electrode therefor.

An alternative embodiment of the invention is represented by a device 70 shown in Figure 4. This device includes a semiconductor body 72 having four alternating zones 74, 76, 78, 80 of opposite type conductivity material arranged, for example, in P-N-P-N order. Rectifying barriers 75, 77, 79 separate these zones. In this embodiment, a plurality of spaced alternately positioned holes 82, 84 are formed in the semiconductor body. The first hole 82, for example, is arranged to intersect all of the P-type zone 78 and portions of the adjacent N-type zones 76 and 80 including the barriers 77 and 79. The next hole 84 is positioned off-center from the first hole 82 and is arranged to intersect all of the N-type zone 76 and portions of each adjacent P-type zone 74 and 78 including the barriers 75 and 77. Other similar alternately positioned holes may be formed in the semiconductor body according to the number of stages of amplification desired in the completed device. In this embodiment of the invention too, the outer P-type and N-type zones 74 and 80 respectively are biased in the forward direction with respect to their adjacent zones by suitable batteries 86, 88. Since the outer P and N-type zones are continuous only a single connection thereto from each of the batteries is required. An ohmic contact electrode 90 is connected to the P-type zone 78 at one end thereof and a source of signal voltage 92 is connected thereto. The device shown in Figure 4 operates in a manner similar to that described above for the device shown in Figure 1. Thus, the first stage of amplification includes a portion 94 of zone 80 (emitter), portion 96 of zone 78 (base) and portion 98 of zone 76 (collector). The second stage includes portion 100 of zone 74 (emitter), portion 98 of zone 76 (base) and portion 102 of zone 78 (collector).

The third stage includes a portion of zone 94 (emitter), portion 102 of zone 78 (base) and a portion 104 of zone 76 (collector). An output lead 106 is bonded to the portion 104 and is connected to a suitable output circuit (not shown).

It is to be understood that modifications of the invention may be made within the scope of the invention. For example, the zones or strips may be arranged in N-P-N-P order and the first channel may originate from the first or fourth zones.

What is claimed is:

1. A unitary cascade semiconductor amplifier comprising a plurality of semiconductor devices formed in a single block of semiconductor material, each of said devices including alternating regions of P-type and N-type conductivity material separated by P-N junctions adapted to operate as emitter, collector and base electrode regions, the collector electrode of each device comprising the base electrode of the next succeeding device.

2. A unitary cascade semiconductor amplifier comprising a plurality of semiconductor devices formed in a single block of semiconductor material, each of said devices including emitter, collector and base electrode regions, the collector electrode of each device comprising the base electrode of the next succeeding device.

3. A unitary cascade semiconductor amplifier comprising a plurality of semiconductor devices formed in a single block of semiconductor material, each of said devices including alternating regions of P-type and N-type conductivity material adapted to operate as emitter, collector and base electrode regions, the collector electrode of each device comprising the base electrode of the next succeeding device, said devices being alternately N-P-N and P-N-P devices.

4. An electrical device comprising a semiconductor body having four alternating regions of P-type and N-type conductivity material, the first and fourth of said regions being biased in the forward direction with respect to the region adjacent thereto, one of the second and third regions being adapted to have an electrical input signal applied thereto, and a plurality of transverse channels formed in said body, said channels intersecting in alternate arrangement first said first, second and third regions and then said second, third and fourth regions.

5. An electrical device comprising a semiconductor body having four alternating zones of P-type and N-type conductivity material, the first and fourth of said zones being biased in the forward direction with respect to the zone adjacent thereto, the second zone being adapted to have an electrical input signal applied thereto, and a plurality of transverse channels formed in said body, said channels intersecting in alternate arrangement first said first, second and third zones and then said second, third and fourth zones.

6. An electrical device comprising a semiconductor body having four alternating regions of P-type and N-type conductivity material, the first and fourth of said regions being biased in the forward direction with respect to the region adjacent thereto, means for applying an electrical input signal to said third region, and a plurality of transverse channels formed in said body, said channels intersecting in alternate arrangement first said first, second and third regions and then said second, third and fourth regions.

7. An electrical device comprising a semiconductor body having four alternating regions of P-type and N-type conductivity material separated by P-N junctions, the first and fourth of said regions being biased in the forward direction with respect to the second and third regions respectively, means applying an electrical input signal to one of the second and third regions, a plurality of transverse channels formed in said body along the length thereof, said channels intersecting in alternate arrangement first all of said first and second regions and a portion of said third region, then all of said fourth and third regions and a portion of said second region.

8. An electrical device comprising a semiconductor body having four alternating regions of P-type and N-type conductivity material separated by P-N junctions, the first and fourth of said regions being biased in the forward direction with respect to the second and third regions respectively, one of the second and third regions being adapted to have an electrical input signal applied thereto, and a plurality of openings in said body, said openings intersecting alternately first all of said second region and portions of said first and third regions, then all of said third regions and portions of said second and fourth regions.

9. A semiconductor signal translating device comprising a pair of junction transistor units each having emitter, base and collector regions, the base region of one unit being integral with the collector region of the other of said pair of units.

10. A semiconductor signal translating device comprising a plurality of junction transistor units each having emitter, base and collector regions, said units being successively interconnected with the collector region of one unit being integral with the base region of the net unit.

References Cited in the file of this patent

UNITED STATES PATENTS

| | | |
|---|---|---|
| 2,402,661 | Ohl | June 25, 1946 |
| 2,623,102 | Shockley | Dec. 23, 1952 |